US010651384B2

United States Patent
Zhao et al.

(10) Patent No.: US 10,651,384 B2
(45) Date of Patent: May 12, 2020

(54) DOUBLE-LAYER MASK COMPONENT AND EVAPORATION DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Rong Zhao, Beijing (CN); Long Jin, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 196 days.

(21) Appl. No.: 15/864,437

(22) Filed: Jan. 8, 2018

(65) Prior Publication Data

US 2018/0342676 A1      Nov. 29, 2018

(30) Foreign Application Priority Data

May 23, 2017   (CN) .................... 2017 2 0578925 U (51) Int. Cl.
*H01L 51/00* (2006.01)
*C23C 14/04* (2006.01)
*H01L 51/56* (2006.01)
*C23C 14/24* (2006.01)
*C23C 16/04* (2006.01)

(52) U.S. Cl.
CPC ........ *H01L 51/0011* (2013.01); *C23C 14/042* (2013.01); *C23C 14/24* (2013.01); *C23C 16/04* (2013.01); *C23C 16/042* (2013.01); *H01L 51/56* (2013.01)

(58) Field of Classification Search
CPC ... H01L 51/0011; H01L 51/56; C23C 14/042; C23C 14/24; C23C 16/04; C23C 16/042
See application file for complete search history.

(56) References Cited

U.S. PATENT DOCUMENTS

| 8,925,480 B2 * | 1/2015 | Kim ...................... C23C 14/042 |
| | | 118/504 |
| 2016/0312354 A1 * | 10/2016 | Ko .......................... C23C 14/042 |
| 2016/0343945 A1 * | 11/2016 | Kim ....................... C23C 14/042 |
| 2017/0263867 A1 * | 9/2017 | Kim ...................... H01L 51/0011 |
| 2017/0282212 A1 * | 10/2017 | Kang .................... B05C 21/005 |

(Continued)

*Primary Examiner* — Jeffrie R Lund
(74) *Attorney, Agent, or Firm* — McDermott Will & Emery LLP (57) ABSTRACT

A double-layer mask component includes a first mask, a first mask frame, a second mask and a second mask frame. The first mask is fixed on the first mask frame, and a first clamping portion is provided within a region which is located on a surface of the first mask frame with the first mask fixed thereon and not covered by the first mask. The second mask is fixed on the second mask frame, and a second clamping portion is provided within a region which is located on a surface of the second mask frame with the second mask fixed thereon and not covered by the second mask. The surface of the first mask frame and the surface of the second mask frame are arranged in opposite, and the first clamping portion and the second clamping portion are clamped, so that the first mask fits with the second mask.

9 Claims, 8 Drawing Sheets

(56) References Cited

U.S. PATENT DOCUMENTS

2017/0365822 A1* 12/2017 Kim .................... H01L 27/3246
2018/0342676 A1* 11/2018 Zhao ................... H01L 51/0011
2019/0378983 A1* 12/2019 Kim ....................... H01L 51/56

* cited by examiner

DOUBLE-LAYER MASK COMPONENT AND EVAPORATION DEVICE

CROSS-REFERENCE TO RELATED APPLICATION

This application claims priority to Chinese Patent Application No. 201720578925.3, filed on May 23, 2017, titled "DOUBLE-LAYER MASK COMPONENT AND EVAPORATION DEVICE", which is incorporated herein by reference in its entirety.

TECHNICAL FIELD

The present disclosure relates to the technical field of display, and in particular to a double-layer mask component and an evaporation device.

BACKGROUND

Due to their excellent characteristics of backlight-free, high contrast, small thickness, wide angle of view and the like, organic light-emitting diode (OLED) display screens are increasingly applied to display devices.

During the production of an OLED display screen, an organic layer needs to be evaporated onto a substrate by a mask component adapted to the precision of an OLED display unit, so as to form the OLED display unit. In the prior art, during the manufacturing of an OLED display screen, a double-layer mask component will be used.

SUMMARY

In a first aspect of the present disclosure, a double-layer mask component is provided, including:

a first mask;

a first mask frame, the first mask being fixed on the first mask frame, a first clamping portion being provided within a region which is located on a surface of the first mask frame with the first mask fixed thereon and not covered by the first mask;

a second mask; and a second mask frame, the second mask being fixed on the second mask frame, a second clamping portion being provided within a region which is located on a surface of the second mask frame with the second mask fixed thereon and not covered by the second mask; wherein, the surface of the first mask frame with the first mask fixed thereon and the surface of the second mask frame with the second mask fixed thereon are arranged in opposite (facing each other), and the first clamping portion and the second clamping portion are clamped so that the first mask fits with the second mask.

Optionally, the first clamping portion includes at least one bump, and the second clamping portion includes at least one groove or hollow-out portion.

Optionally, the at least one bump includes an annular bump surrounding the first mask by one cycle.

Optionally, the at least one groove includes an annular groove surrounding the second mask by one cycle.

Optionally, the first mask frame includes four borders, the first mask is fixed across a first and a second borders opposite to each other in the four borders, and the at least one bump comprises two bumps, which are respectively arranged on a third and a fourth borders opposite to each other in the four borders.

Optionally, the first mask includes an open mask, and the second mask includes a fine metal mask.

Optionally, the first mask includes a fine metal mask, and the second mask includes an open mask.

In a second aspect of the present disclosure, an evaporation device is provided, including an evaporation source and the double-layer mask component described in the first aspect of the present disclosure.

Optionally, in the situation that the double-layer mask component comprises a fine metal mask, the fine metal mask is located on a side of the double-layer mask component which is close to the evaporation source.

DETAILED DESCRIPTION

The technical solutions in the embodiments of the present disclosure will be described clearly and completely with reference to the accompanying drawings in the embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure. The embodiments of the disclosure will be described below in detail with reference to the accompanying drawings. It should be understood that embodiments described herein are only for illustration and explanation of the disclosure, but not for limitation to the disclosure.

In the embodiments of the present disclosure, words such as "exemplarily" or "for example" are used for examples, illustration or description. Any embodiment or design solution described as "exemplarily" or "for example" in the embodiments of the present disclosure shall not be interpreted as being more preferable or advantageous than other embodiments or design solutions. More exactly, words such as "exemplarily" or "for example" are used to present related concepts concretely.

The double-layer mask used in OLED display manufacturing is realized by tensioned welding a fine metal mask (also referred to a high-precision metal mask, FMM for short) onto an open mask component (i.e., a component formed after welding an open mask onto a mask frame), i.e., by welding the fine metal after flattening it by applying a certain tensioning force thereto. Specifically, the welding the fine mask onto the open mask component is welding the fine metal mask onto the mask frame in the open mask component.

After the fine metal mask is welded onto the mask frame in the open mask component, due to the support of welds, there will be a certain gap between the open mask and the fine metal mask in the double-layer mask so that the open mask and the fine metal mask cannot be closely fitted with each other. Consequently, after the welding is completed and the tensioning force applied to the FMM is released, the fine metal mask will be wrinkled. Therefore, during the evaporation using the double-layer mask, the qualified rate of the evaporation will be reduced due to the wrinkles on the double-layer mask.

Embodiments of the present disclosure provide a double-layer mask component and an evaporation device in order to solve the problem that the open mask and the fine metal mask in the double-layer mask cannot be closely fitted with each other.

Figure 1:
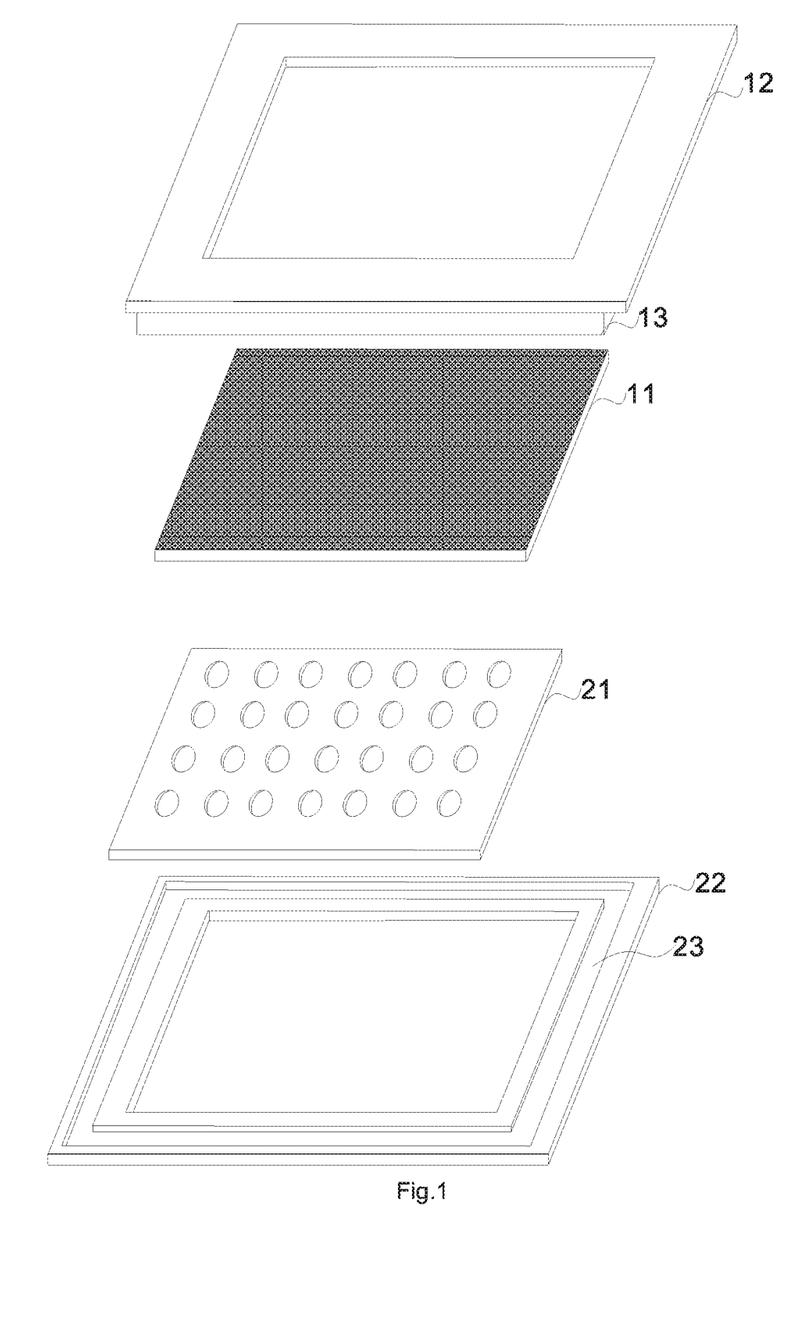
FIG. 1 is a first schematic diagram of structure of a double-layer mask component according to an embodiment of the present disclosure.

As shown in FIG. 1, an embodiment of the present disclosure provides a double-layer mask component. The double-layer mask component includes a first mask 11 and a first mask frame 12. The first mask 11 is fixed on the first mask frame 12, and a first clamping portion 13 is provided within a region which is located on a surface of the first mask frame 12 with the first mask 11 fixed thereon and not covered by the first mask 11.

The double-layer mask also component includes a second mask 21 and a second mask frame 22. The second mask 21 is fixed on the second mask frame 22, and a second clamping portion 23 is provided within a region which is located on a surface of the second mask frame 22 with the second mask 21 fixed thereon and not covered by the second mask 21.

The surface of the first mask frame 12 with the first mask 11 fixed thereon and the surface of the second mask frame 22 with the second mask 21 fixed thereon are arranged in opposite, and the first clamping portion 13 and the second clamping portion 23 are clamped, so that the first mask 11 fits with the second mask 21.

The embodiments of the present disclose provide a double-layer mask component. The double-layer mask component includes a first mask 11, a first mask frame 12, a second mask 21 and a second mask frame 22. The first mask 11 is fixed on the first mask frame 12, and a first clamping portion 13 is provided within a region which is located on a surface of the first mask frame 12 with the first mask 11 fixed thereon and not covered by the first mask 11. The second mask 21 is fixed on the second mask frame 22, and a second clamping portion 23 is provided within a region which is located on a surface of the second mask frame 22 with the second mask 21 fixed thereon and not covered by the second mask 21. The surface of the first mask frame 12 with the first mask 11 fixed thereon and the surface of the second mask frame 22 with the second mask 21 fixed thereon are arranged in opposite, and the first clamping portion 13 and the second clamping portion 23 are clamped, so that the first mask 11 fits with the second mask 21. There are no welds between the first mask 11 and the second mask 21. Therefore, in the double-layer mask component, the first mask 11 and the second mask 21 can be closely fitted with each other. In addition, wrinkles on the double-layer mask can be eliminated and the qualified rate of evaporation can be improved.

In an embodiment of the present disclose, the first clamping portion 13 may comprise at least one bumps, and the second clamping portion 23 may comprise at least one groove or hollow-out portion. In an embodiment of the present disclosure, the double-layer mask component provided in the embodiment of the present disclosure will be described by taking the first clamping portion 13 being at least one bump and the second clamping portion 23 being at least one groove as example.

In the embodiment of the present disclosure, the first mask 11 may be fixed on the first mask frame 12 by welding, and the second mask 21 may be fixed on the second mask frame 22 by welding.

Figure 2:
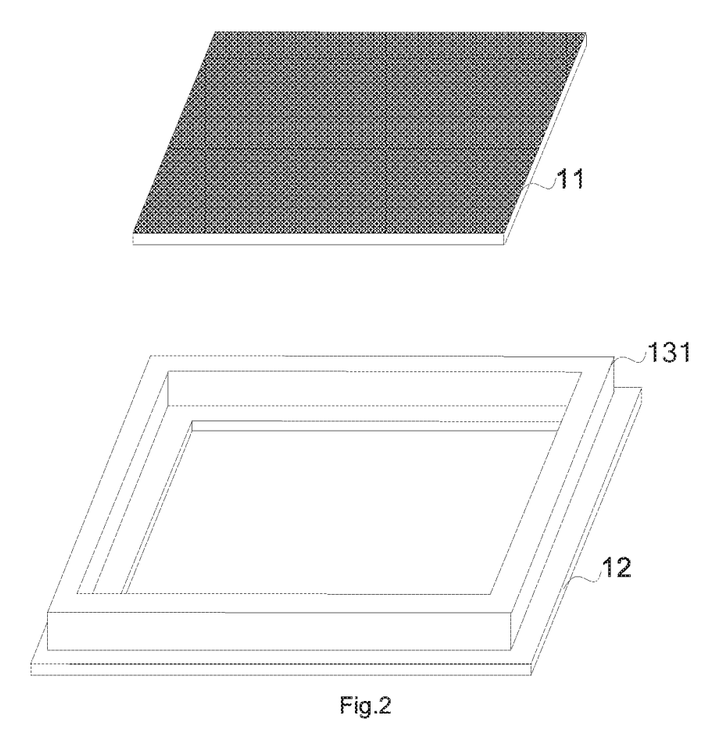
FIG. 2 is a schematic diagram of structures of a first mask and a first mask frame according to an embodiment of the present disclosure.
Figure 3:
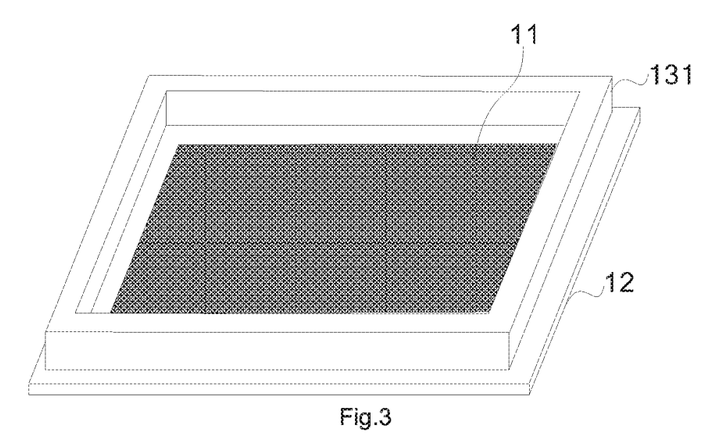
FIG. 3 is a schematic diagram of structure of the first mask being fixed on the first mask frame according to an embodiment of the present disclosure.

FIG. 2 shows a schematic diagram of structures of the first mask 11 and the first mask frame 12 according to the embodiment of the present disclosure, and FIG. 3 shows a schematic diagram of the structure of the first mask 11 being fixed on the first mask frame 12 according to an embodiment of the present disclosure. It can be known from FIGS. 2 and 3 that at least one bump is provided within a region which is located on a surface of the first mask frame 12 with the first mask 11 fixed thereon and not covered by the first mask 11.

The at least one bump in the embodiment of the present disclosure may be an annular bump 131 surrounding the circumference of the first mask 11, as shown in FIGS. 2 and 3. The at least one bump in the embodiment of the present disclosure may also be multiple bumps arranged at intervals.

Figure 4:
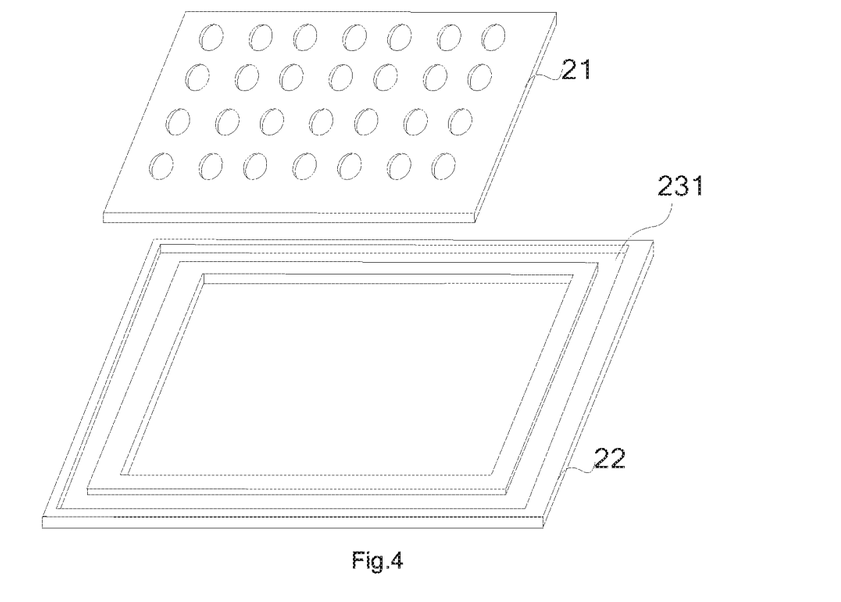
FIG. 4 is a schematic diagram of structures of a second mask and a second mask frame according to an embodiment of the present disclosure.
Figure 5:
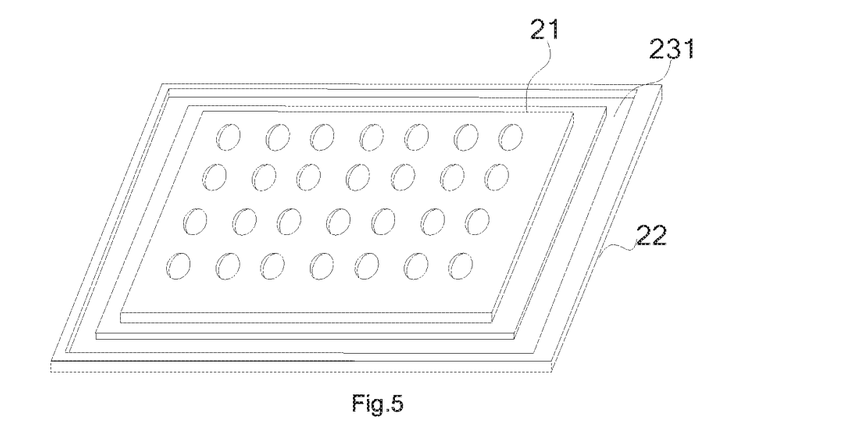
FIG. 5 is a schematic diagram of structure of the second mask being fixed on the second mask frame according to an embodiment of the present disclosure.

FIG. 4 shows a schematic diagram of structure of the second mask 21 and the second mask frame 22 according to the embodiment of the present disclosure, and FIG. 5 shows a schematic diagram of the structure after the second mask 21 is fixed on the second mask frame 22 according to an embodiment of the present disclosure. It can be known from FIGS. 4 and 5 that at least one groove is provided within a region which is located on a surface of the second mask frame 22 with the second mask 21 fixed thereon and not covered by the second mask 21.

The at least one groove of the present disclose may be an annular groove 231 surrounding the circumference of the second mask 21, as shown in FIGS. 4 and 5. As another optional solution, the at least one groove in the embodiment of the present disclosure may also be multiple grooves arranged at intervals.

In some embodiments of the present disclosure, the first mask 11 may be an open mask and the second mask 21 may be a fine metal mask; alternatively, the first mask 11 may be a fine metal mask and the second mask 21 may be an open mask. The accompanying drawings in the embodiment are illustrated by taking the first mask 11 being a fine metal mask and the second mask 21 being an open mask as example.

Figure 6:
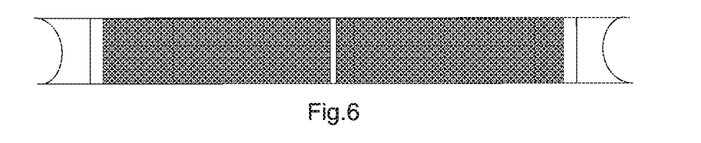
FIG. 6 is a schematic diagram of structure of fine metal mask slats according to an embodiment of the present disclosure.

It is to be noted that, in practical applications, the fine metal mask may consist of a plurality of fine metal mask slats shown in FIG. 6.

Figure 7:
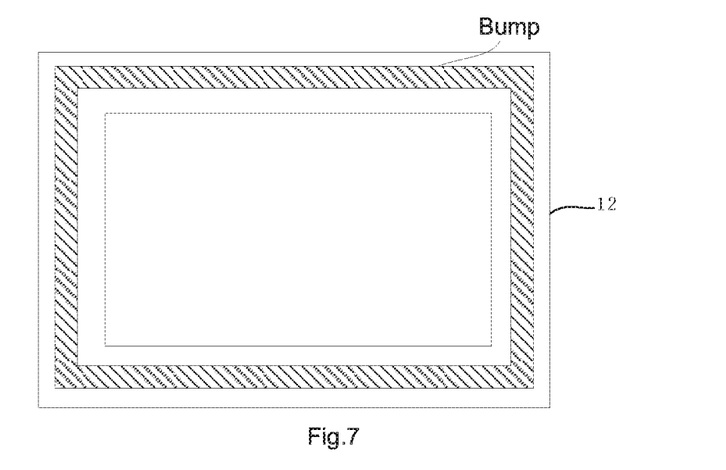
FIG. 7 is a schematic diagram of a fine metal mask frame according to an embodiment of the present disclosure.
Figure 8:
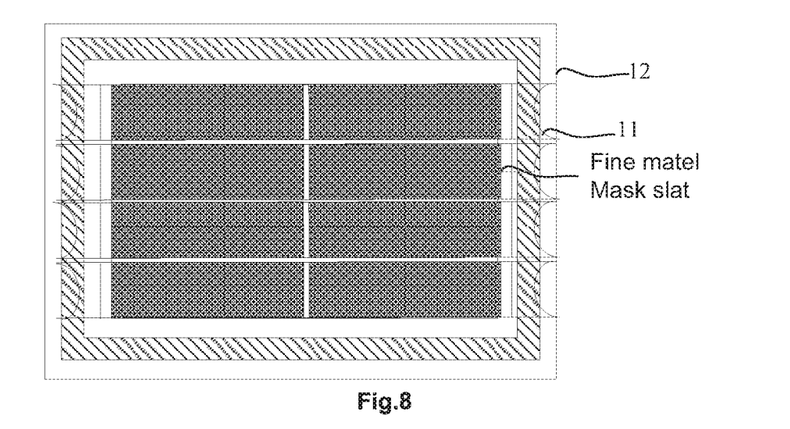
FIG. 8 is a schematic diagram of structure of a fine metal mask component according to an embodiment of the present disclosure.

Exemplarily, FIG. 7 shows a schematic diagram of a fine metal mask frame with an annular bump provided thereon. As shown in FIG. 8, the first mask 11 (i.e., the fine metal mask) shown in FIGS. 1 to 3 may consist of four fine metal mask slats. The four fine metal mask slats may be successively fixed on the fine metal mask frame shown in FIG. 7, forming the structure shown in FIG. 8. The structure in FIG. 8 may be called a fine metal mask component.

Figure 9:
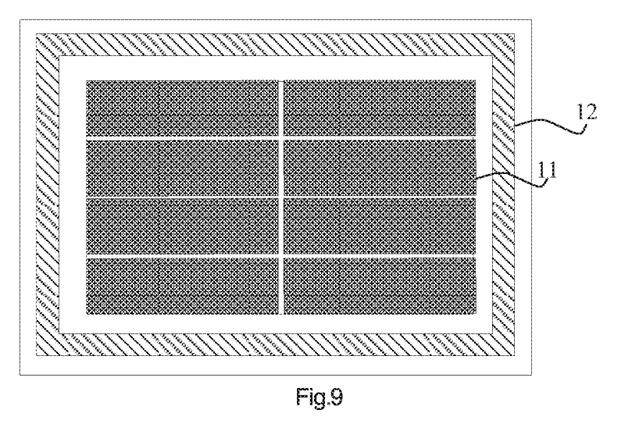
FIG. 9 shows a cut fine metal mask component according to an embodiment of the present disclosure.

With reference to FIG. 8, after the fine metal mask slats are successively fixed on the fine metal mask frame, ineffective regions of the fine metal mask slats may be cut off to obtain the structure shown in FIG. 9, to prevent the ineffective regions of the fine metal mask slats from occluding the bump on the fine metal mask frame. The structure shown in FIG. 9 may be called the cut fine metal mask component.

Figure 15:
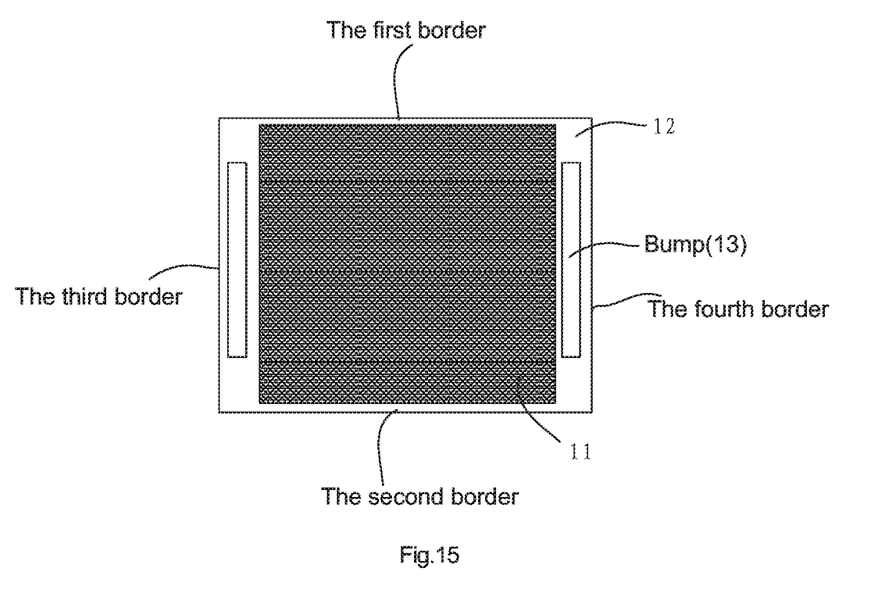
FIG. 15 shows a schematic diagram of structures of a first mask and a first mask frame according to another embodiment of the present disclosure.

In the embodiment of the present disclosure, as shown in FIG. 15, the first mask frame 12 may include four borders, the first mask 11 is fixed across a first and a second borders opposite to each other in the four borders, and two bumps are arranged on a third and fourth borders opposite to each other in the four borders. Exemplarily, the fine metal mask slats may be fixed across the first and the second borders opposite to each other, and the two bumps may be arranged respectively on the third and the fourth borders opposite to each other. In this way, the ineffective regions of the fine metal mask slats will not occlude the bumps arranged respectively on the third and fourth borders, and there is no need of cutting the fine metal mask slats.

Generally, the fine metal mask is mainly used for evaporating a pixel unit (which may also be called a pixel point), so the hollow-out pattern within the effective region of the metal mask may be designed according to the shape and size of the pixel unit to be evaporated. This will not be limited in the embodiment of the present disclosure.

Generally, the open mask is mainly used for realizing a display region, so the hollow-out pattern within the effective region of the open mask may be designed according to the shape and size of the display region to be realized.

Figure 10:
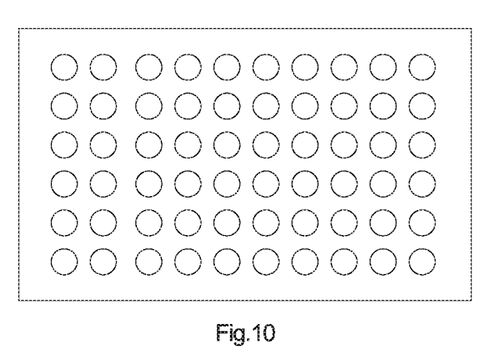
FIG. 10 is a schematic diagram of structure of an open mask according to an embodiment of the present disclosure.

In practical applications, the open mask may be of a structure shown in FIG. 10. FIG. 10 shows an open mask arranged by taking the display region to be realized being circular as example.

Figure 11:
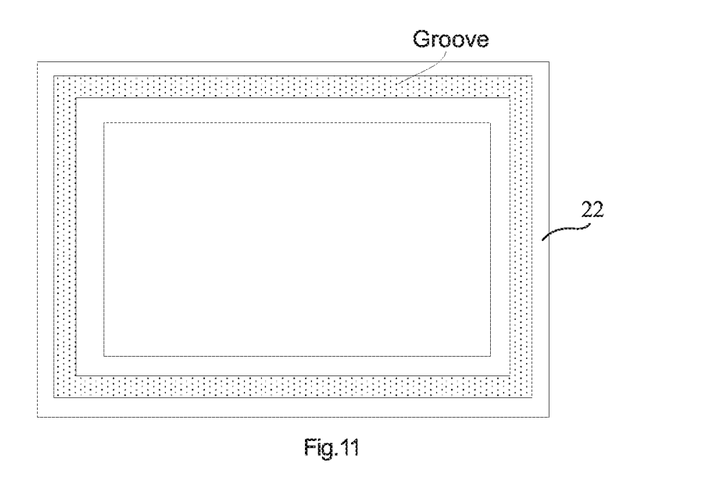
FIG. 11 is a schematic diagram of structure of an open mask frame according to an embodiment of the present disclosure.
Figure 12:
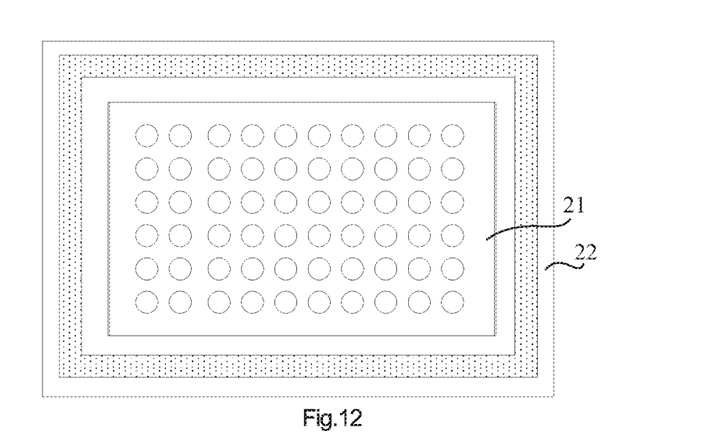
FIG. 12 is a schematic diagram of structure of an open mask component according to an embodiment of the present disclosure.

FIG. 11 shows a schematic diagram of an exemplary open mask frame. As shown in FIG. 12, the second mask 21 (i.e., the open mask) shown in FIGS. 1, 4 and 5 may be an open mask which may be fixed on the open mask frame shown in FIG. 11 (the structure shown in FIG. 12 may be called an open mask component).

In the embodiment of the present disclosure, the surface of the fine metal mask frame with the fine metal mask fixed thereon in the structure shown in FIG. 9 and the surface of the open mask frame with the open mask fixed thereon in the structure shown in FIG. 12 may be arranged in opposite, and the bump on the fine metal mask frame and the groove on the open mask frame are clamped so that the fine metal mask fits with the open mask.

Figure 13:
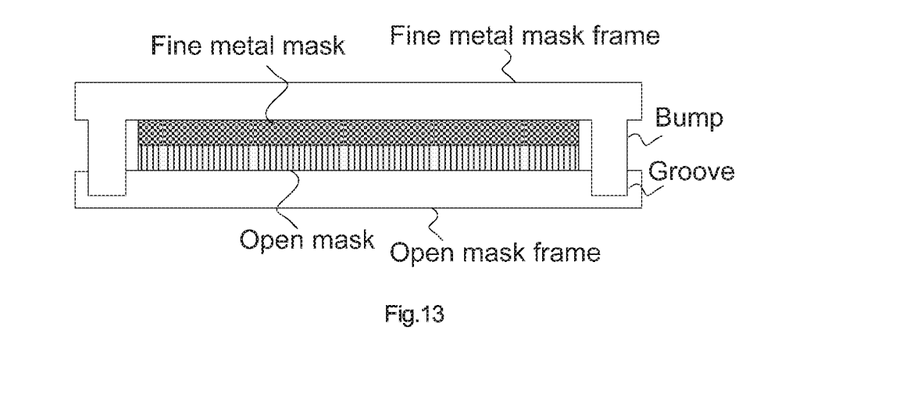
FIG. 13 is a second schematic diagram of structure of the double-layer mask component according to an embodiment of the present disclosure.

FIG. 13 shows a schematic diagram of the structure of the double-layer mask after clamping. In order to illustrate the clamped structure more clearly, the schematic structure diagram of the double-layer mask in FIG. 13 is a sectional view of the double-layer mask.

In some embodiments of the present disclosure, during the arrangement of the bump, the height of the bump may be greater than the sum of the thickness of the fine metal mask and the thickness of the open mask but less than or equal to the sum of the thickness of the fine metal mask, the thickness of the open mask and the depth of the groove. In FIG. 13, description will be given by taking the height of the bump being equal to the sum of the thickness of the fine metal mask, the thickness of the open mask and the depth of the groove as example.

Figure 14:
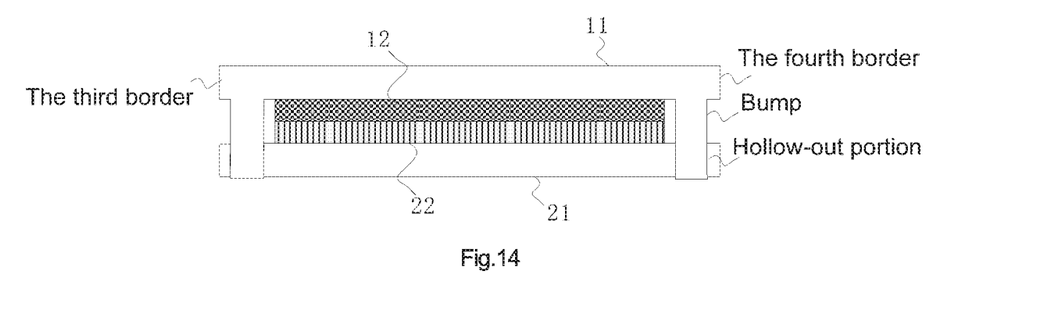
FIG. 14 is a third schematic diagram of a structure of a double-mask component according to an embodiment of the present disclosure.

FIG. 14 shows a schematic diagram of a structure of a double-mask component according to an embodiment of the present disclosure. FIG. 15 shows a schematic diagram of structures of a first mask 11 and a first mask frame 12 according to another embodiment of the present disclosure. The first mask frame 12 of the embodiment is provided with two bumps as the first clamping portion 13, and the two bumps are disposed respectively on the third and the fourth borders opposite to each other in the four borders of the first mask frame 12. The first mask 11 is fixed across the first and the second borders opposite to each other of the first mask frame 12. The second mask frame 22 is provided with two hollow-out portions as the second clamping portion 23. The positions of the two hollow-out portions corresponds to the positions of the two bumps on the first mask frame 12 in a one to one correspondence.

The embodiment of the present disclosure provides a double-layer mask component. The double-layer mask component includes a first mask 11, a first mask frame 12, a second mask 21 and a second mask frame 22. The first mask 11 is fixed on the first mask frame 12, and a first clamping portion 13 is provided within a region which is located on a surface of the first mask frame 12 with the first mask 11 fixed thereon and not covered by the first mask 11. The second mask 21 is fixed on the second mask frame 22, and a second clamping portion 23 is provided within a region which is located on a surface of the second mask frame 22 with the second mask 21 fixed thereon and not covered by the second mask 21. The surface of the first mask frame 12 with the first mask 11 fixed thereon and the surface of the second mask frame 22 with the second mask 21 fixed thereon are arranged in opposite, and the first clamping portion 13 and the second clamping portion 23 are clamped, so that the first mask 11 fits with the second mask 21. Therefore, in the double-layer mask component, the first mask 11 and the second mask 21 can be closely fitted with each other, so that wrinkles on the double-layer mask can be eliminated and the qualified rate of evaporation can be improved.

Since the first mask 11 and the second mask 21 may be closely fitted with each other, better support and occlusion can be realized, so that no filling bar (generally called a cover, for the purpose of occlusion) nor support bar (generally called a howling, for the purpose of supporting) needs to be welded in the double-layer mask.

Figure 16:
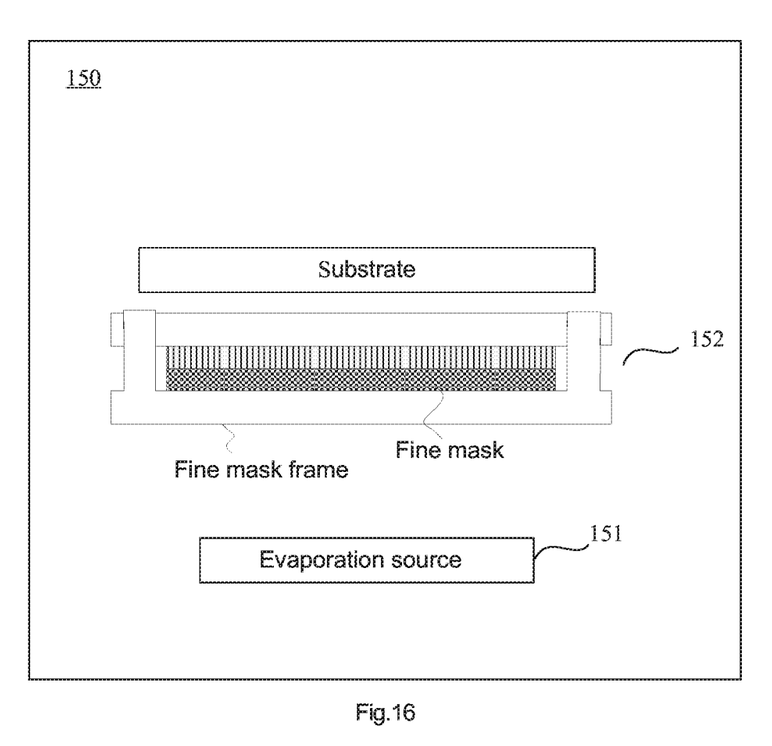
FIG. 16 is a schematic diagram of structure of an evaporation device according to an embodiment of the present disclosure.

As shown in FIG. 16, an embodiment of the present disclosure provides an evaporation device 150, including an evaporation source 151 and the double-layer mask component 152 provided in the above embodiment.

In some embodiments of the present disclose, the double mask component 152 is positioned such that the fine metal mask in it is located on a side close to the evaporation source 151. That means the result would be that the evaporation source 151 will be located on the side of double-layer mask component 152 which is close to the fine metal mask. In FIG. 15, the evaporation source 151 is located on one side (lower side of the double-layer mask component in FIG. 15) of the double-layer mask component 152, while a substrate is placed on the other side (upper side of the double-layer mask component in FIG. 15) of the double-layer mask component 152. Since the fine metal mask and the open mask in the double-layer mask component in the evaporation device provided in the embodiment of the present disclosure can be closely fitted with each other, winkles on the double-layer mask can be eliminated and the qualified rate of evaporation can be improved.

The foregoing descriptions merely show specific implementations of the present disclosure, but the protection scope of the present disclosure is not limited thereto. Any person of skill in the art may easily conceive of variations or replacements within the technical scope disclosed by the present disclosure, and these variations or replacements shall fall into the protection scope of the present disclosure. Therefore, the protection scope of the present disclosure shall be subject to the protection scope of the claims.

What is claimed is:

1. A double-layer mask component, comprising:
    a first mask;
    a first mask frame, the first mask being fixed on the first mask frame, a first clamping portion being provided within a region which is located on a surface of the first mask frame with the first mask fixed thereon and not covered by the first mask;
    a second mask; and
    a second mask frame, the second mask being fixed on the second mask frame, a second clamping portion being provided within a region which is located on a surface of the second mask frame with the second mask fixed thereon and not covered by the second mask;
    wherein the first mask frame and the second mask frame stack, and the surface of the first mask frame with the first mask fixed thereon and the surface of the second mask frame with the second mask fixed thereon are arranged facing each other, and the first clamping portion and the second clamping portion are clamped so that the first mask fits with the second mask.

2. The double-layer mask component according to claim 1, wherein the first clamping portion comprises at least one bump and the second clamping portion comprises at least one groove or hollow-out portion.

3. The double-layer mask component according to claim 2, wherein the at least one bump comprises an annular bump surrounding the first mask by one cycle.

4. The double-layer mask component according to claim 2, wherein the at least one groove comprises an annular groove surrounding the second mask by one cycle.

5. The double-layer mask component according to claim 2, wherein the first mask frame comprises four borders, the first mask is fixed across a first and a second borders opposite to each other in the four borders, and the at least one bump comprises two bumps, which are arranged respectively on a third and a fourth borders opposite to each other in the four borders.

6. The double-layer mask component according to claim 1, wherein the first mask comprises an open mask and the second mask comprises a fine metal mask.

7. The double-layer mask component according to claim 1, wherein the first mask comprises a fine metal mask and the second mask comprises an open mask.

8. An evaporation device, comprising an evaporation source, and further comprising the double-layer mask component according to claim 1.

9. The evaporation device according to claim 8, wherein in the situation that the double-layer mask component comprises a fine metal mask, the fine metal mask is located on a side of the double-layer mask component which is close to the evaporation source.

* * * * *